United States Patent
Anpo et al.

(10) Patent No.: US 10,240,350 B2
(45) Date of Patent: Mar. 26, 2019

(54) FREE ACCESS FLOOR STRUCTURE, AND MANUFACTURING APPARATUS AND CARRIER APPARATUS ADAPTED FOR FLOOR STRUCTURE

(71) Applicants: SANYO CO., LTD., Fujioka-shi (JP); NATIONAL INSTITUTE OF ADVANCED INDUSTRIAL SCIENCE AND TECHNOLOGY, Tokyo (JP)

(72) Inventors: Tadanari Anpo, Fujioka (JP); Shiro Hara, Tsukuba (JP)

(73) Assignees: NATIONAL INSTITUTE OF ADVANCED INDUSTRIAL SCIENCE AND TECHNOLOGY, Tokyo (JP); SANYO CO., LTD., Fujioka (JP)

(*) Notice: Subject to any disclaimer, the term of this patent is extended or adjusted under 35 U.S.C. 154(b) by 84 days.

(21) Appl. No.: 15/101,603

(22) PCT Filed: Dec. 2, 2014

(86) PCT No.: PCT/JP2014/081817
§ 371 (c)(1),
(2) Date: Jun. 3, 2016

(87) PCT Pub. No.: WO2015/083679
PCT Pub. Date: Jun. 11, 2015

(65) Prior Publication Data
US 2016/0318535 A1    Nov. 3, 2016

(30) Foreign Application Priority Data

Dec. 3, 2013  (JP) .................................. 2013-250534
Dec. 3, 2013  (JP) .................................. 2013-250535

(51) Int. Cl.
*E04F 15/024* (2006.01)
*H01L 21/677* (2006.01)
*B62B 3/06* (2006.01)

(52) U.S. Cl.
CPC .......... *E04F 15/02405* (2013.01); *B62B 3/06* (2013.01); *E04F 2290/02* (2013.01); *H01L 21/67724* (2013.01); *H01L 21/67775* (2013.01)

(58) Field of Classification Search
CPC ....................... E04F 15/02405; E04F 2290/02
(Continued)

(56) References Cited

U.S. PATENT DOCUMENTS 4,538,950 A  *  9/1985  Shiomi ............... B23Q 7/1426
                                                  104/307
4,664,590 A  *  5/1987  Maekawa ............ B23Q 3/1556
                                                  104/89
(Continued)

FOREIGN PATENT DOCUMENTS

JP          63-255460        10/1988
JP          4-11773          1/1992
(Continued)

OTHER PUBLICATIONS

International Search Report dated Feb. 17, 2015 in corresponding International Application No. PCT/JP2014/081817.

*Primary Examiner* — James Keenan
(74) *Attorney, Agent, or Firm* — Staas & Halsey LLP

(57) ABSTRACT

A free access floor structure to install a manufacturing apparatus such as a semiconductor manufacturing apparatus, in a short time, and a manufacturing apparatus and a carrier apparatus adapted for the floor structure. An embodiment of the manufacturing apparatus includes an apparatus-side connector which is provided, facing downward, to a bottom plate of a manufacturing apparatus. A floor structure of an embodiment includes a floor plate to be worked into a floor (Continued)

surface. The floor structure includes a floor-side connector which is provided, facing upward, to the floor plate so as to be connected with the apparatus-side connector according to a lowering operation of the manufacturing apparatus. An installation step (mounting step, piping/wiring step) of the manufacturing apparatus may thereby be performed in one step. As a result, the labor and the time required to install the manufacturing apparatus may be saved.

8 Claims, 8 Drawing Sheets

(58) Field of Classification Search
USPC .................................................. 414/396, 401
See application file for complete search history.

(56) References Cited

U.S. PATENT DOCUMENTS

| | | | | |
|---|---|---|---|---|
| 4,922,670 | A | * | 5/1990 | Naka ................. E04F 15/02405 52/126.6 |
| 5,245,805 | A | * | 9/1993 | Takeda ............. E04F 15/02405 52/126.6 |
| 5,452,983 | A | * | 9/1995 | Parmley, Sr. ............. B60S 5/06 414/345 |
| 5,474,411 | A | * | 12/1995 | Schoenfeld ......... E04B 1/34807 141/232 |
| 5,655,869 | A | * | 8/1997 | Scheler ............. H01L 21/67775 414/222.01 |
| 5,695,315 | A | * | 12/1997 | Doi ..................... B41F 27/1206 414/396 |
| 5,992,108 | A | * | 11/1999 | Falcey ..................... E04B 5/48 52/126.6 |
| 6,033,175 | A | * | 3/2000 | Pflueger ............... B23Q 7/1442 414/396 |
| 6,202,374 | B1 | * | 3/2001 | Cooper ..................... E04B 5/48 52/126.3 |
| 6,709,225 | B1 | * | 3/2004 | Pitts .................. H01L 21/67766 414/267 |
| 6,748,707 | B1 | * | 6/2004 | Buchalter ............. E04F 15/024 439/131 |
| 9,281,223 | B2 | | 3/2016 | Hara |
| 2008/0029464 | A1 | * | 2/2008 | Tanaka .................. A47B 81/06 211/40 |
| 2013/0162117 | A1 | | 6/2013 | Hara et al. |
| 2013/0167339 | A1 | | 7/2013 | Hara et al. |

FOREIGN PATENT DOCUMENTS

| | | |
|---|---|---|
| JP | 2008-280783 | 11/2008 |
| JP | 2011-258721 | 12/2011 |
| JP | 2011-258722 | 12/2011 |
| JP | 2012-54414 | 3/2012 |
| JP | 2014-108744 | 6/2014 |

* cited by examiner

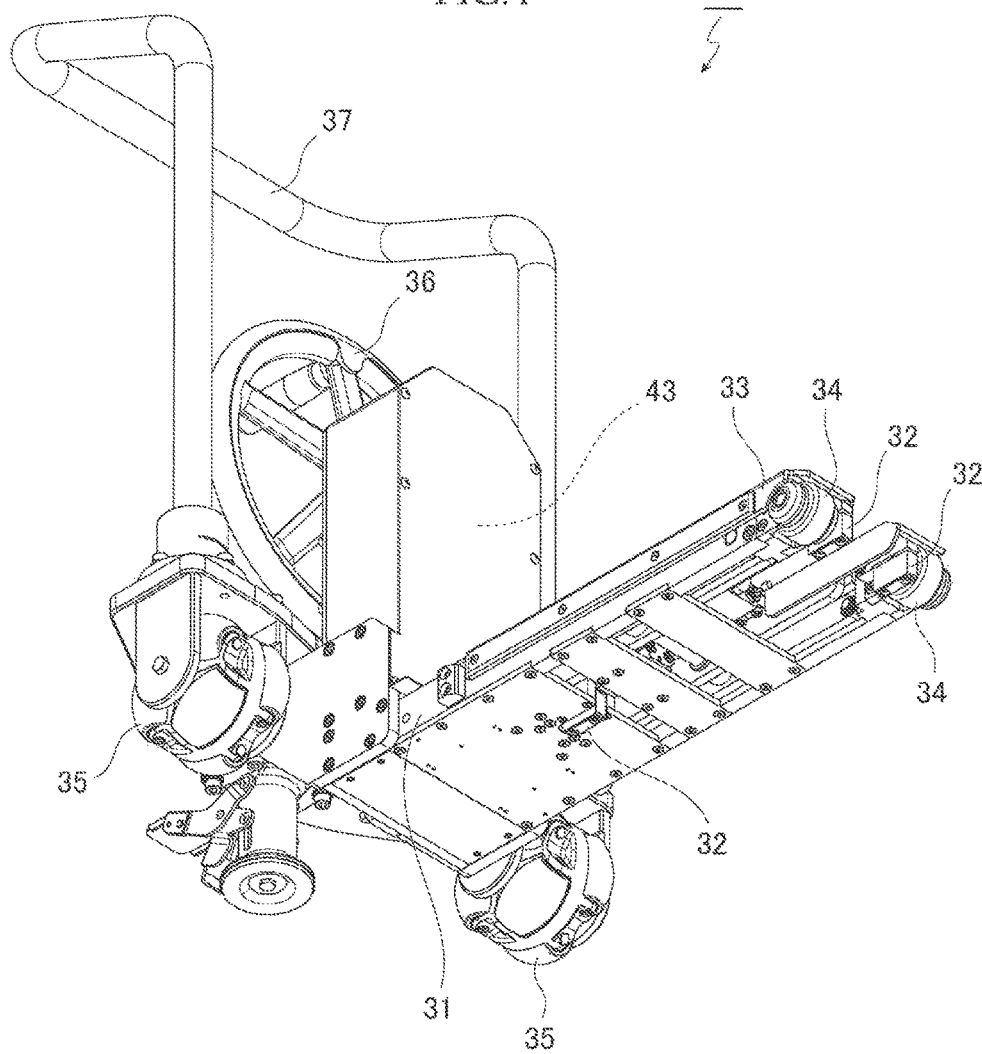

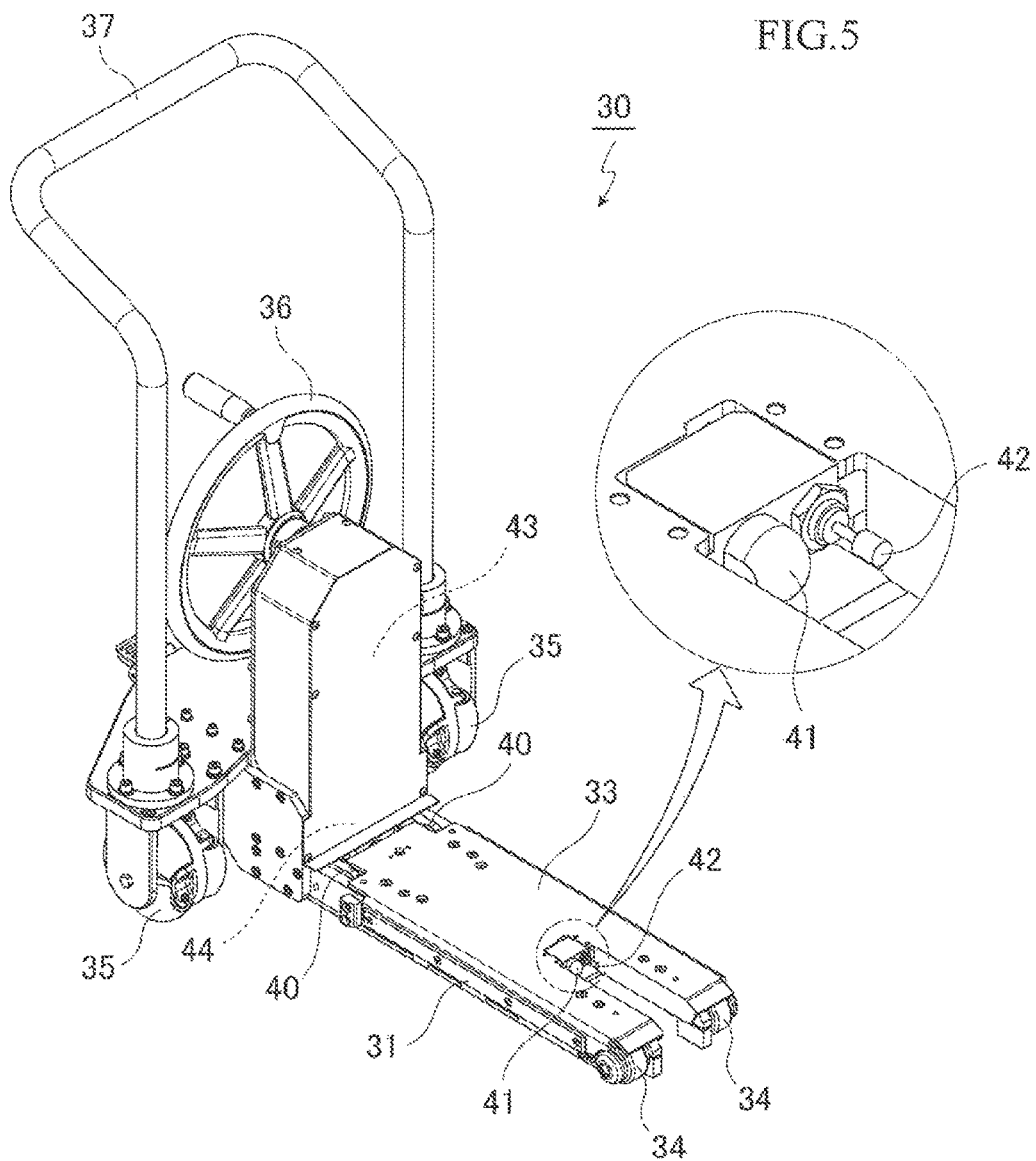

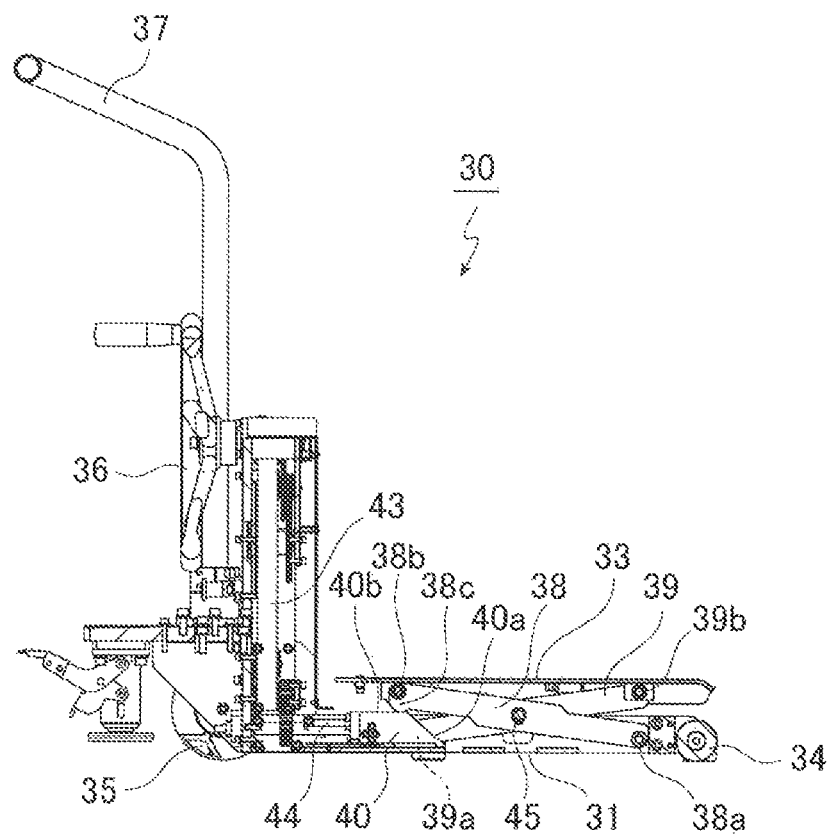

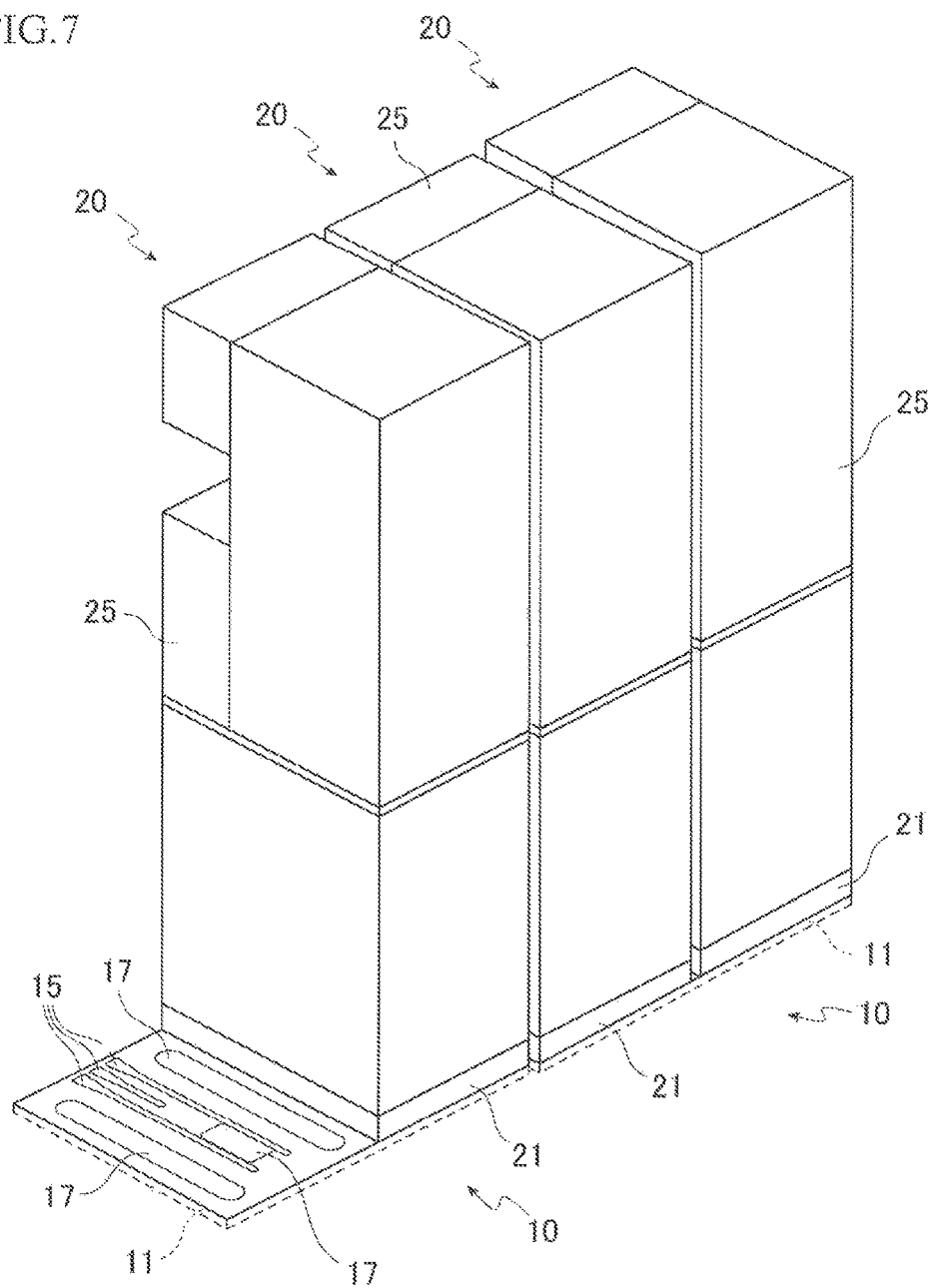

FREE ACCESS FLOOR STRUCTURE, AND MANUFACTURING APPARATUS AND CARRIER APPARATUS ADAPTED FOR FLOOR STRUCTURE

CROSS-REFERENCE TO RELATED APPLICATIONS

This application is a U.S. National Stage Application, which claims the benefit under 35 U.S.C. § 371 of PCT International Patent Application No. PCT/JP2014/081817, filed Dec. 2, 2014 which claims the foreign priority benefit under 35 U.S.C. § 119 of Japanese Patent Application No. 2013-250534, filed Dec. 3, 2013, and Japanese Patent Application No. 2013-250535, filed on Dec. 3, 2013, the contents of which are incorporated herein by reference.

TECHNICAL FIELD

The present invention relates to a free access floor structure, and a manufacturing apparatus and a carrier apparatus adapted for the floor structure. The present invention is particularly suitable when applied to a free access floor structure on which a semiconductor manufacturing apparatus for manufacturing a small-diameter semiconductor wafer with a diameter equal to or smaller than 20 mm is to be installed, and a semiconductor manufacturing apparatus and a carrier apparatus (lifter) adapted for the floor structure.

BACKGROUND ART

Conventionally, in semiconductor manufacturing technology, the unit cost of manufacturing chips is reduced by increasing the diameter of the semiconductor wafers. This caused the sizes and costs of apparatuses used in a series of manufacturing processes to increase steadily, and the scale and the construction/operation cost of a manufacturing plant to swell. Such a large-scale manufacturing system contributes to reduction in the unit cost of manufacturing chips in a case of mass production of a small variety, but is not suitable for meeting a demand for small-quantity production of a wide variety, and makes adjustment of the amount of production according to the market condition and entry of small to medium-sized companies difficult.

Accordingly, to solve these problems, there are proposed small semiconductor manufacturing apparatuses capable of manufacturing semiconductor chips at a low cost by using small-diameter semiconductor wafers (for example, see Patent Literatures 1 to 3).

CITATION LIST

Patent Literature

Patent Literature 1: Japanese Patent Laid-Open No. 2011-258721
Patent Literature 2: Japanese Patent Laid-Open No. 2011-258722
Patent Literature 3: Japanese Patent Laid-Open No. 2012-054414

SUMMARY OF INVENTION

Technical Problem

Conventionally, to install a semiconductor manufacturing apparatus, the semiconductor manufacturing apparatus was mounted on the floor (mounting step), and then pipes and electrical wires were connected to the rear face of the semiconductor manufacturing apparatus (piping/wiring step). Accordingly, two steps (mounting step, piping/wiring step) were necessary to install the semiconductor manufacturing apparatus, and there was an inconvenience that the labor and the time required were inevitably increased. Especially in the case of small-quantity production of a wide variety, a plurality of semiconductor manufacturing apparatuses are frequently rearranged in response to switching of the manufacturing processes, and thus it is important to install the semiconductor manufacturing apparatuses within a time period as short as possible.

In view of the above circumstances, the present invention has its first object to provide a free access floor structure enabling a manufacturing apparatus such as a semiconductor manufacturing apparatus, to be installed in a short time. Also, the second object is to provide a manufacturing apparatus suitable for such a free access floor structure. Still further, the third object is to provide a carrier apparatus suitable for such a free access floor structure.

Solution to Problem

To achieve the object above, a free access floor structure according to the present invention is a free access floor structure on which a manufacturing apparatus having an apparatus-side connector provided, facing downward, to a bottom plate is to be installed, comprising: a floor plate to be installed on a floor surface, and a floor-side connector which is provided, facing upward, to the floor plate so as to be connected with the apparatus-side connector according to a lowering operation of the manufacturing apparatus.

According to the free access floor structure of the present invention, preferably, the floor plate is provided with a first positioning mechanism to position the bottom plate of the manufacturing apparatus at a predetermined position with respect to the floor plate, and thus, fitting positions of the apparatus-side connector and the floor-side connector coincide with each other in a horizontal direction in the positioned state.

According to the free access floor structure of the present invention, preferably, the floor plate is provided with a second positioning mechanism to position, in a width direction, a frame of a carrier apparatus carrying the manufacturing apparatus.

According to the free access floor structure of the present invention, preferably, the apparatus-side connector and the floor-side connector are connectors to connect a gas supply pipe, an exhaust gas pipe, a power cable, or a LAN cable.

According to the free access floor structure of the present invention, preferably, the floor-side connector is attached to a through hole of the floor plate without protruding upward from an upper surface of the floor plate, and a cover is provided to the through hole in a detachable/attachable manner.

A manufacturing apparatus according to the present invention is a manufacturing apparatus to be installed on a free access floor structure having a floor-side connector provided, facing upward, to a floor plate, comprising: an apparatus-side connector which is provided, facing downward, to a bottom plate so as to be connected with the floor-side connector according to a lowering operation of the manufacturing apparatus, and a first positioning target mechanism, which is provided to the bottom plate, to position the bottom plate with respect to the floor plate in cooperation with a first positioning mechanism provided to the floor plate of the free access floor structure.

According to the manufacturing apparatus of the present invention, preferably, one of the first positioning mechanism and the first positioning target mechanism includes three V-grooves and another thereof includes three spherical bodies, and the bottom plate is positioned with respect to the floor plate by the spherical bodies fitted into the corresponding V-grooves.

According to the manufacturing apparatus of the present invention, preferably, the three V-grooves are formed along a substantially Y shape in plan view.

A carrier apparatus according to the present invention is a carrier apparatus to lift and carry a manufacturing apparatus, where the carrier apparatus includes a frame that is capable of moving on a floor surface, where a first arm is supported on the frame in a manner capable of rotating around one end portion, and a second arm is supported on the frame in a manner capable of rotating around one end portion, where a lift plate is mounted on upper sides of another end portion of the first arm and another end portion of the second arm, where a wedge guide is provided on the frame in a manner capable of advancing or retracting, and where, when the wedge guide advances and an inclined surface portion of the wedge guide pushes a contact portion of the other end portion of the first arm up an inclined surface of the inclined portion, the first arm is rotated around the one end portion and the second arm is rotated around its one end portion in coordination with the first arm so as to raise the lift plate.

According to the carrier apparatus of the present invention, preferably, a horizontal portion is formed at an upper portion of the wedge guide, and when the lift plate reaches a highest position, the contact portion is moved onto the horizontal portion.

According to the carrier apparatus of the present invention, preferably, the contact portion of the first arm has a protruding curved shape, and the horizontal portion of the wedge guide is formed continuously to the inclined surface portion.

According to the carrier apparatus of the present invention, preferably, the frame is provided with a fitting portion to be fitted into a fitting receiving portion of the manufacturing apparatus, and the frame is to be positioned at a predetermined position with respect to the manufacturing apparatus by the fitting portion being fitted into the fitting receiving portion at a time of insertion of the lift plate under the manufacturing apparatus.

According to the carrier apparatus of the present invention, preferably, the frame is provided with an abutting portion to be abutted against an abutment receiving portion of the manufacturing apparatus, and impact applied to the manufacturing apparatus by the frame is to be mitigated by the abutting portion abutting against the abutment receiving portion at a time of insertion of the lift plate under the manufacturing apparatus.

Advantageous Effects of Invention

According to the free access floor structure of the present invention, the installation step (mounting step and piping/wiring step) of a manufacturing apparatus may be performed in one step. As a result, the labor and the time required to install a manufacturing apparatus may be saved, and the manufacturing apparatus may be installed in a short time.

According to the free access floor structure of the present invention, since the first positioning mechanism is provided, the bottom plate of the manufacturing apparatus may be positioned at a predetermined position with respect to the floor plate of the floor structure, and thus the connectors may be smoothly connected with each other in a short time.

According to the free access floor structure of the present invention, since the second positioning mechanism is provided, the frame of the carrier apparatus carrying the manufacturing apparatus may be positioned, in the width direction, with respect to the floor plate of the floor structure, and thus the manufacturing apparatus may be accurately and swiftly loaded.

According to the free access floor structure of the present invention, a gas supply pipe, an exhaust gas pipe, a power cable or a LAN cable may be easily connected by using the apparatus-side connector and the floor-side connector.

According to the free access floor structure of the present invention, because the floor-side connector does not protrude upward from the upper surface of the floor plate, when the floor structure is not being used, the floor surface may be made substantially flat, and the safety and the general utility of the floor surface may be increased.

According to the manufacturing apparatus of the present invention, the installation step of the manufacturing apparatus may be performed in one step in cooperation with the free access floor structure of the present invention described above. As a result, the labor and the time required to install the manufacturing apparatus may be saved, and the manufacturing apparatus may be installed in a short time.

According to the manufacturing apparatus of the present invention, positioning may be performed by a simple configuration by configuring the first positioning mechanism and the first positioning target mechanism by the V-groove and the spherical body.

Also, by forming three V-grooves along a Y shape, the bottom plate may be positioned with high accuracy.

According to the carrier apparatus of the present invention, the manufacturing apparatus of the present invention described above may be lifted up by a simple work, and as a result, removal of the manufacturing apparatus is facilitated.

According to the carrier apparatus of the present invention, by causing the contact portion of the first arm to move onto the horizontal portion of the wedge guide, the lift plate of the carrier apparatus may be prevented from being lowered under the weight of the manufacturing apparatus at the time of carrying the manufacturing apparatus, and thus the manufacturing apparatus may be safely and smoothly carried by the carrier apparatus.

According to the carrier apparatus of the present invention, the contact portion of the first arm has a protruding curved shape, and the horizontal portion of the wedge guide is formed continuously to the inclined surface portion, and thus the sliding resistance of the contact portion of the first arm to the horizontal portion and the inclined surface portion of the wedge guide may be reduced, and the contact portion of the first arm may easily move onto the horizontal portion from the inclined surface portion of the wedge guide.

According to the carrier apparatus of the present invention, by providing the fitting portion to be fitted into the fitting receiving portion of the manufacturing apparatus, the frame of the carrier apparatus may be accurately positioned with respect to the manufacturing apparatus at the time of insertion of the lift plate of the carrier apparatus under the manufacturing apparatus. As a result, when placing the manufacturing apparatus on the lift plate, the manufacturing apparatus may be stably placed at a predetermined position on the lift plate.

According to the carrier apparatus of the present invention, by providing the abutting portion to be abutted against the abutment receiving portion of the manufacturing apparatus, impact applied to the manufacturing apparatus by the frame of the carrier apparatus at the time of insertion of the lift plate of the carrier apparatus under the manufacturing apparatus may be mitigated. As a result, occurrence of situations where the manufacturing apparatus is damaged by the impact at the time of being carried may be suppressed.

BRIEF DESCRIPTION OF DRAWINGS

FIG. 4 is a perspective view (from obliquely below) of a carrier apparatus according to the first embodiment.

FIG. 5 is a perspective view of the carrier apparatus of lift-up fixing type according to the first embodiment of the present invention.

FIG. 6B is a vertical cross-sectional view showing the carrier apparatus of lift-up fixing type according to the first embodiment, showing a state where a lift plate is at the highest position.

FIG. 7 is a perspective view showing a state where a plurality of semiconductor manufacturing apparatuses according to the first embodiment are installed on the floor.

DESCRIPTION OF EMBODIMENTS

Hereinafter, a first embodiment of the present invention will be described.

FIGS. 1 to 7 show the first embodiment of the present invention.

<Configuration of Small Semiconductor Manufacturing Apparatus>

Figure 1:
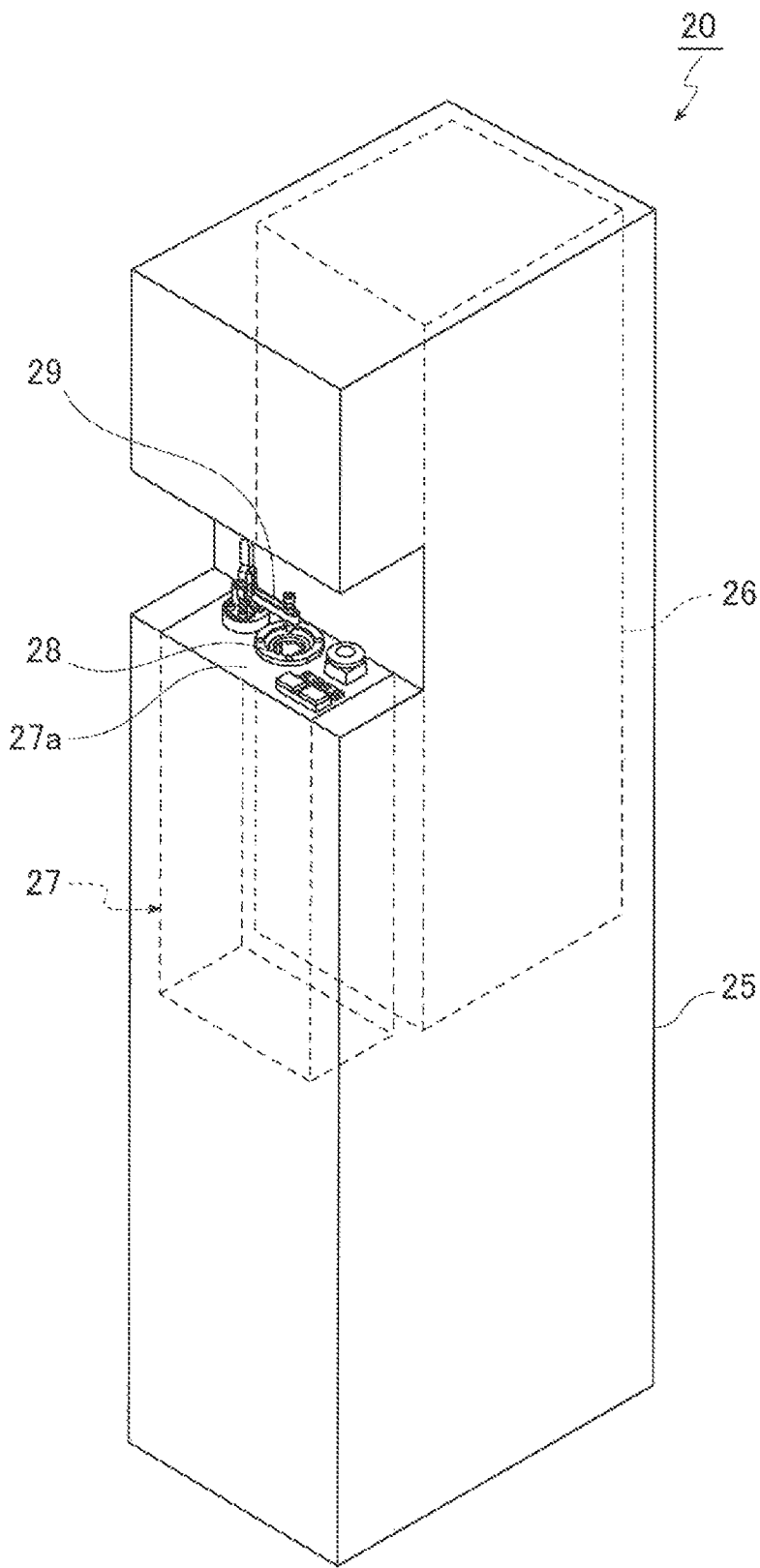
FIG. 1 is a perspective view showing a semiconductor manufacturing apparatus according to a first embodiment of the present invention.

As shown in FIG. 1, a small semiconductor manufacturing apparatus (a manufacturing apparatus) 20 according to the first embodiment has a housing 25 having a substantially cuboid shape of a predetermined size (for example, 30 cm in width, 60 cm in depth, and 144 cm in height). A processing apparatus 26, such as a resist coating apparatus or an exposure apparatus, and an apparatus front chamber 27 are accommodated inside the housing 25, and the processing apparatus 26 and the apparatus front chamber 27 are configured to be able to be separated from each other.

The processing apparatus 26 receives a semiconductor wafer from the apparatus front chamber 27 through a wafer entrance, not shown, and performs known processing, such as a resist film forming process or an exposure process, on the semiconductor wafer. In the first embodiment, a small-diameter semiconductor wafer with a diameter equal to or smaller than 20 mm (for example, 12.5±0.2 mm) is used.

For its part, the apparatus front chamber 27 is a chamber where the semiconductor wafer accommodated in a wafer conveying container (not shown) is taken out and conveyed to the processing apparatus 26. A container mount 28 for mounting the wafer conveying container, and a securing lever 29 for pressing down and fixing the wafer conveying container mounted on the container mount 28 are provided to a top plate 27a of the apparatus front chamber 27. Also, a conveyor robot (not shown) for loading the semiconductor wafer taken out from under the wafer conveying container into the processing apparatus 26 is provided to the apparatus front chamber 27.

Figure 2:
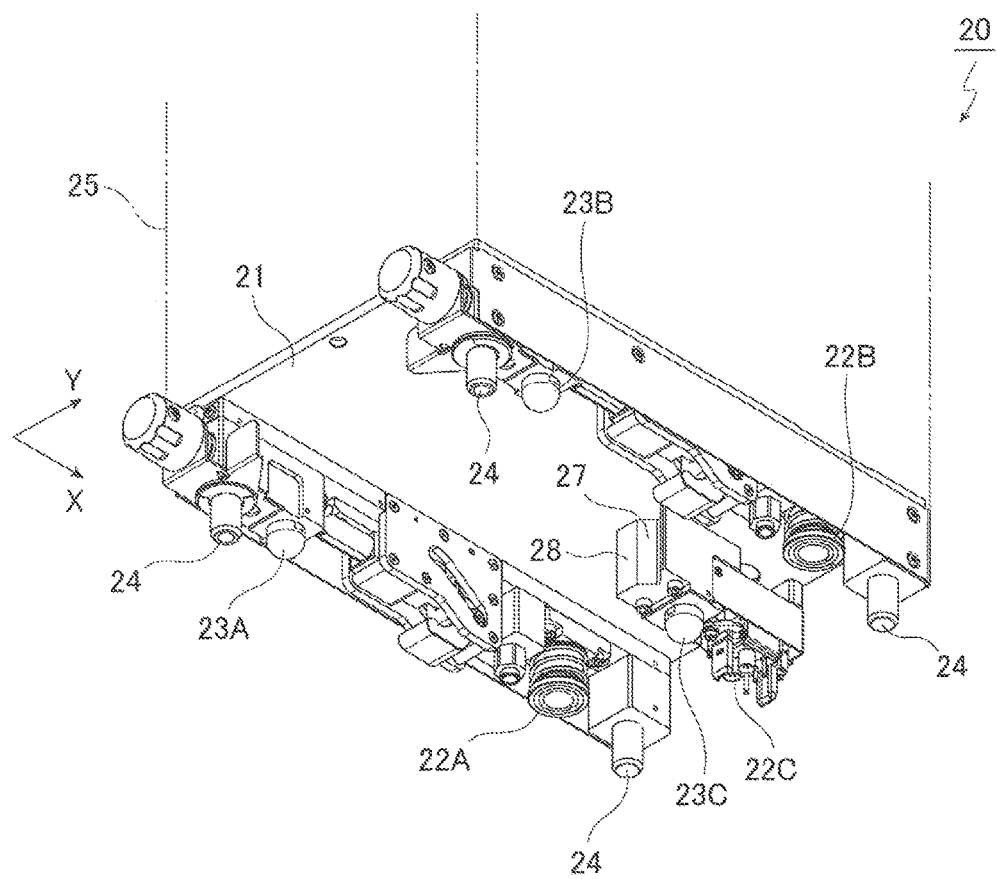
FIG. 2 is a perspective view (from obliquely below) showing a bottom plate of the semiconductor manufacturing apparatus according to the first embodiment.

Furthermore, as shown in FIG. 2, a rectangular bottom plate 21 is horizontally attached to a bottom portion of the housing 25, and near the four corners of the bottom plate 21, four support columns 24 with a predetermined length are attached facing downward to reach lower than male connectors 22A, 22B, 22C and spherical bodies 23A, 23B, 23C described later. The three male connectors 22A to 22C (corresponding to "apparatus-side connector" of the present invention) for a gas supply pipe (nitrogen gas, compressed air), an exhaust gas pipe, and an AC power cable are attached, facing downward, to the bottom plate 21. Furthermore, the three spherical bodies 23A to 23C (corresponding to "first positioning target mechanism" of the present invention) having a semi-spherical shape are attached, facing downward, to the bottom plate 21, at the vertices of an isosceles triangle in plan view, the spherical bodies being for positioning the bottom plate 21 with respect to a floor plate 11 described later in cooperation with three V-grooves 18 described later.

<Configuration of Floor Structure>

Figure 3:
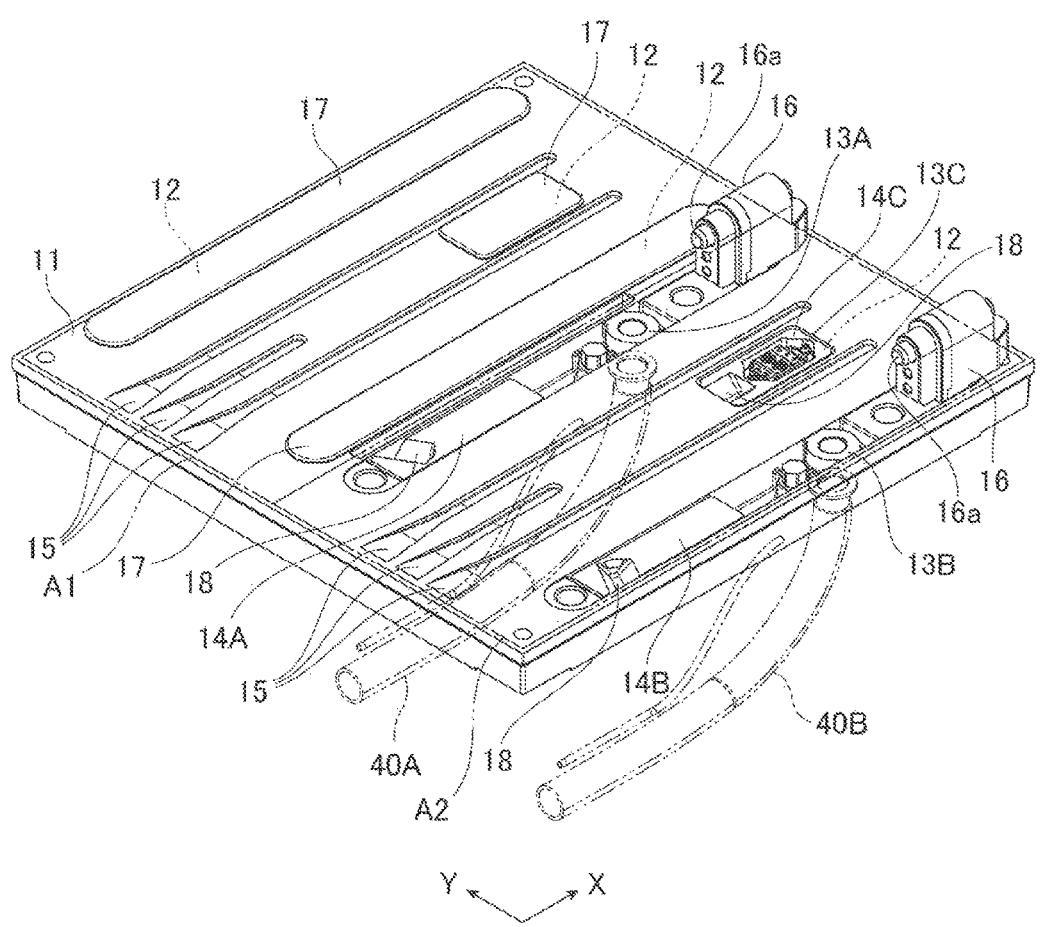
FIG. 3 is a perspective view (from obliquely above) of a floor structure according to the first embodiment.

Furthermore, as shown in FIG. 3, a floor structure 10 includes a rectangular floor plate 11 (for example, 60 cm by 60 cm) to be worked into the floor surface. Two semiconductor manufacturing apparatuses 20 may be installed adjacent to each other on the floor plate 11. Two mounting regions A1, A2 are formed on the floor plate 11, corresponding to the two semiconductor manufacturing apparatuses 20. Three through holes 12 are formed to each of the mounting regions A1, A2 in a manner vertically penetrating mounting region, and a cover 17 is provided to each of the through holes 12 in a detachable/attachable manner to cover the through hole. Three female connectors 13A, 13B, 13C (corresponding to "floor-side connector" of the present invention) to be connected with the three male connectors 22A to 22C of the semiconductor manufacturing apparatus 20 are attached, facing upward, to the through holes 12. A gas supply pipe 40A and an exhaust gas pipe 40B are connected to the female connectors 13A, 13B, respectively. Also, V-groove seats 14A, 14B, 14C are provided to respective through holes 12 in a manner facing the spherical bodies 23A to 23C of the semiconductor manufacturing apparatus 20, and a V-groove 18 (corresponding to "first positioning mechanism" of the present invention) is formed to each of the V-groove seats 14A to 14C. The three V-grooves 18 here are formed along a substantially Y shape in plan view. Moreover, the female connectors 13A to 13C and V-groove seats 14A to 14C are all buried in the floor plate 11, and do not protrude upward from the upper surface of the floor plate 11. Moreover, three guide grooves 15 (corresponding to "second positioning mechanism" of the present invention) are formed on the surface of the floor plate 11, for each of the mounting regions A1, A2. Furthermore, two plug-in stoppers 16 are attached, for each of the mounting regions A1, A2, on the surface of the floor plate 11 in a detachable/attachable manner, and each stopper 16 includes a contact portion 16a of synthetic resin.

<Configuration of Carrier Apparatus>

A carrier apparatus according to the first embodiment is shown in FIGS. 4, 5, 6A and 6B.

A carrier apparatus 30 of lift-up fixing type according to the first embodiment includes a frame 31. Two front wheels 34 and two rear wheels 35 are rotatably attached to the frame 31, and a handle 37 is also attached to the frame 31. Also, a first arm 38 and a second arm 39 are supported at each of the right and left sides of the frame 31, the first arm 38 and the second arm 39 being supported in a manner capable of synchronously rotating around one end portion 38a and one end portion 39a, respectively. The one end portion 38a of each first arm 38 is rotatably attached to the frame 31, and the one end portion 39a of each second arm 39 is attached to the frame 31 in a manner capable of rotating and of moving in the front-back direction of the carrier apparatus 30 (the left-right direction in FIGS. 6A and 6B). Also, the first arm 38 and the second arm 39 are rotatably coupled, approximately at their center portions, through a horizontal linking shaft 45 having a round bar shape. Furthermore, a lift plate 33 is horizontally mounted on the upper side of other end portions 38b of the pair of first arms 38 and other end portions 39b of the pair of second arms 39. Moreover, as shown in FIGS. 6A and 6B, on each of the left and right sides of the frame 31, a wedge guide 40 is configured to move in the front-back direction of the carrier apparatus 30 (the left-right direction in FIGS. 6A and 6B) by rotation of the wheel 36 in the forward-backward direction and by a belt 43 and a ball screw 44.

The lift plate 33 is attached to the frame 31 in a manner capable of being raised or lowered, and by turning the wheel 36 in the forward-backward direction, the lift plate 33 may be raised or lowered through a power transmission mechanism 43 including a timing belt, a ball screw and the like. Moreover, three guide plates 32 (corresponding to "second positioning target mechanism" of the present invention) of synthetic resin for positioning the frame 31 in the width direction (direction orthogonal to the direction of loading the semiconductor manufacturing apparatus 20) in cooperation with the three guide grooves 15 are attached, facing downward, to the bottom surface of the frame 31, the guide plates 32 being attached in a manner capable of being raised or lowered by coil springs (not shown).

Figure 6A:
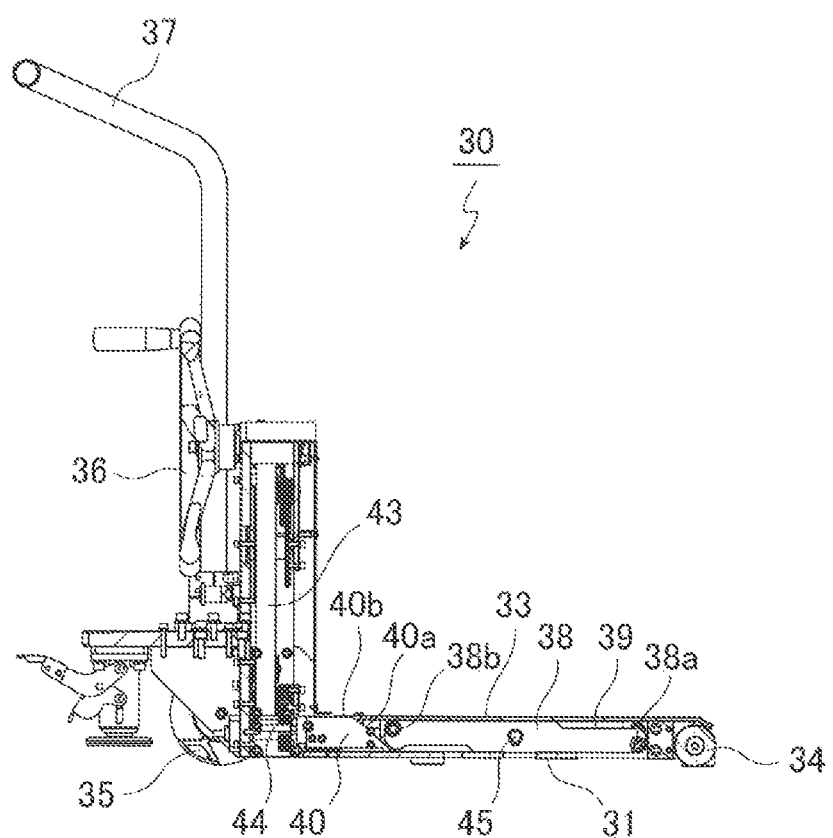
FIG. 6A is a vertical cross-sectional view showing the carrier apparatus of lift-up fixing type according to the first embodiment, showing a state where a lift plate is at the lowest position.

Also, as shown in FIGS. 6A and 6B, a horizontal portion 40b is formed at the upper portion of each wedge guide 40, continuously to an inclined surface portion 40a. Moreover, a contact portion 38c having a protruding curved shape is formed near each of the other end portions 38b of the first arms 38.

As shown in FIG. 6B, when the pair of wedge guides 40 moves to the front side (the right side in FIGS. 6A and 6B) of the carrier apparatus 30, the inclined surface portions 40a of the wedge guides 40 push the contact portions 38c near the other end portions 38b of the pair of first arms 38 upward, the pair of first arms 38 is rotated in the forward direction (direction of raising the other end portions 38b), and also the pair of second arms 39 is rotated in the forward direction (direction of raising the other end portions 39b) in coordination with the first arms 38, and at the same time, the one end portions 39a of the second arms 39 are moved to the front side (the right side in FIGS. 6A and 6B) of the carrier apparatus 30. As a result, the other end portions 38b and the other end portions 39b are synchronously raised while the pair of first arms 38 and the pair of second arms 39 are maintained in a crossed state, which is X-shaped in side view, and the lift plate 33 is raised while in a horizontal state.

On the other hand, as shown in FIG. 6A, when the pair of wedge guides 40 moves to the rear side (the left side in FIGS. 6A and 6B) of the carrier apparatus 30, due to the weight of the first arms 38, the second arms 39 and the lift plate 33, the pair of first arms 38 is rotated in the backward direction (direction of lowering the other end portions 38b), and also the pair of second arms 39 is rotated in the backward direction (direction of lowering the other end portions 39b) in coordination with the first arms 38, and at the same time, the one end portions 39a of the second arms 39 are moved to the rear side (the left side in FIGS. 6A and 6B) of the carrier apparatus 30. As a result, the other end portions 38b and the other end portions 39b are synchronously lowered with the pair of first arms 38 and the pair of second arms 39 coming closer to a state where they are overlapped in a straight line in side view, and the lift plate 33 is lowered while in a horizontal state.

Furthermore, as shown in FIG. 5, a semi-spherical protruding positioning portion 41 (corresponding to "fitting portion" of the present invention) for positioning the frame 31 in the X-direction (depth direction) with respect to the semiconductor manufacturing apparatus 20 described later, and a damper (that is, a shock absorber) 42 (corresponding to "abutting portion" of the present invention) are provided, facing the front side of the carrier apparatus 30, to the frame 31.

<Procedure of Installation Work>

The semiconductor manufacturing apparatus 20, the floor structure 10, and the carrier apparatus 30 are configured in the above manner, and as shown in FIG. 7, when installing a plurality of (three in FIG. 3) semiconductor manufacturing apparatuses 20 on the floor, the semiconductor manufacturing apparatuses 20 are sequentially installed on the floor structure 10 according to the following procedure, by using the carrier apparatus 30.

First, in a loading step, the cover 17 is removed from each through hole 12 of the floor structure 10, and each stopper 16 is attached to the floor plate 11 (see FIG. 3).

Then, the semiconductor manufacturing apparatus 20 may be placed on the carrier apparatus 30 to be carried, by performing a lift plate insertion step and a lift plate raising step described later.

First, the lift plate insertion step is performed. As shown in FIG. 6A, in the lift plate insertion step, the handle 37 of the carrier apparatus 30 is pushed in a state where the lift plate 33 of the carrier apparatus 30 is at the lowest position, and the lift plate 33 of the carrier apparatus 30 is inserted under the bottom plate 21 of the semiconductor manufacturing apparatus 20. Then, the frame 31 of the carrier apparatus 30 is accurately positioned in the X-direction (depth direction) by the protruding positioning portion 41 (see FIG. 5) fitted into a V-groove 27 (see FIG. 2) of the semiconductor manufacturing apparatus 20. As a result, the semiconductor manufacturing apparatus 20 may be stably placed at a predetermined position on the lift plate 33 in the lift plate raising step described later.

At this time, since the damper 42 is provided to the carrier apparatus 30, the damper 42 abuts a pressing portion 28 of the semiconductor manufacturing apparatus 20 immediately before the protruding positioning portion 41 fits into the V-groove 27, and impact applied to the semiconductor manufacturing apparatus 20 by the carrier apparatus 30 may be mitigated. As a result, occurrence of situations where the semiconductor manufacturing apparatus 20 is damaged by the impact at the time of being carried may be suppressed.

Next, the lift plate raising step is performed. In the lift plate raising step, the wheel 36 of the carrier apparatus 30 is turned in the forward direction so as to raise the lift plate 33 of the carrier apparatus 30. Then, the pair of wedge guides 40 moves to the front side (the right side in FIGS. 6A and 6B) of the carrier apparatus 30, and the inclined surface portion 40a of each wedge guide 40 pushes the other end portion 38b of the corresponding first arm 38 upward, and thus the lift plate 33 of the carrier apparatus 30 is raised.

Then, as shown in FIG. 6B, when the lift plate 33 of the carrier apparatus 30 reaches the highest position, the contact portions 38c of the pair of first arms 38 move onto the horizontal portions 40b of the pair of wedge guides 40 from the inclined surface portions 40a. Accordingly, a situation where the lift plate 33 of the carrier apparatus 30 is lowered, at the time of the semiconductor manufacturing apparatus 20 being carried, due to the weight of the semiconductor manufacturing apparatus 20 may be prevented. Therefore, by using this carrier apparatus 30, the semiconductor manufacturing apparatus 20 may be safely and smoothly carried.

Furthermore, since the contact portion 38c of the first arm 38 has a protruding curved shape, as described above, and the horizontal portion 40b of the wedge guide 40 is formed continuously to the inclined surface portion 40a, the sliding resistance between the horizontal portion 40b and the inclined surface portion 40a of the wedge guide 40 and the contact portion 38c of the first arm 38 is reduced. Therefore, the contact portion 38c of the first arm 38 may easily move from the inclined surface portion 40a of the wedge guide 40 onto the horizontal portion 40b when the lift plate 33 of the carrier apparatus 30 reaches the highest position.

The work of lifting up the semiconductor manufacturing apparatus 20 by the carrier apparatus 30 of lift-up fixing type is thereby completed.

After the semiconductor manufacturing apparatus 20 is placed on the lift plate 33 of the carrier apparatus 30 in the above manner, the handle 37 of the carrier apparatus 30 is pushed and the semiconductor manufacturing apparatus 20 is carried to above the floor structure 10. At this time, positioning of the carrier apparatus 30 in the Y-direction (width direction) with respect to the floor plate 11 of the floor structure 10 is accurately performed by the guide plates 32 of the carrier apparatus 30 being engaged with the guide grooves 15 of the floor structure 10. On the other hand, positioning of the carrier apparatus 30 in the X-direction (depth direction) with respect to the floor plate 11 of the floor structure 10 is accurately performed by the rear surface of the semiconductor manufacturing apparatus 20 coming into contact with the contact portions 16a of the pair of left and right stoppers 16 of the floor structure 10. Loading of the semiconductor manufacturing apparatus 20 may therefore be performed accurately and swiftly.

Next, an installation step is performed. The wheel 36 of the carrier apparatus 30 is turned and the lift plate 33 is lowered to lower the semiconductor manufacturing apparatus 20. Then, the semiconductor manufacturing apparatus 20 is mounted on the floor structure 10, and at the same time, the male connectors 22A to 22C of the semiconductor manufacturing apparatus 20 are connected with the respective female connectors 13A to 13C of the floor structure 10, and the operation of connecting pipes and electrical wires is completed. Accordingly, the installation step (mounting step and piping/wiring step) of the semiconductor manufacturing apparatus 20 is performed in one step, and so the labor and the time required to install the semiconductor manufacturing apparatus 20 may be saved. As a result, the semiconductor manufacturing apparatus 20 may be installed in a short time. Moreover, when the semiconductor manufacturing apparatus 20 is installed in this manner, the gas supply pipe 40A and the exhaust gas pipe 40B do not get in the way by protruding from the rear face of the housing 25 of the semiconductor manufacturing apparatus 20, so these pipes 40A and 40B do not cause obstructions.

Additionally, positioning of the bottom plate 21 of the semiconductor manufacturing apparatus 20 (in the X-direction and the Y-direction) with respect to the floor plate 11 of the floor structure 10 is accurately performed by the spherical bodies 23A to 23C being fitted into the V-grooves 18 of the respective V-groove seats 14A to 14C. Accordingly, the operation of connecting the male connectors 22A to 22C and the female connectors 13A to 13C is smoothly performed in a short time with the fitting positions of the corresponding connectors coinciding with each other in the horizontal direction. Moreover, the V-grooves 18 of the three V-groove seats 14A to 14C are formed along a substantially Y shape in plan view, as described above, and thus these V-grooves 18 may accurately position the spherical bodies 23A to 23C at predetermined positions in cooperation with one another, and the bottom plate 21 of the semiconductor manufacturing apparatus 20 may be highly accurately positioned with respect to the floor plate 11 of the floor structure 10.

The installation work of the semiconductor manufacturing apparatus 20 is thereby completed.

As described above, four support columns 24 with a predetermined length are attached, to the semiconductor manufacturing apparatus 20, facing downward at near the four corners of the bottom plate 21, and thus even when the semiconductor manufacturing apparatus 20 is temporarily placed on a flat floor surface other than the floor structure 10, the male connectors 22A to 22C and the spherical bodies 23A to 23C are not damaged by coming into contact with the floor surface.

As described above, the female connectors 13A to 13C and the V-groove seats 14A to 14C of the floor structure 10 do not protrude upward from the upper surface of the floor plate 11. Accordingly, when the floor structure 10 is not used (when the semiconductor manufacturing apparatus 20 is not installed on the floor surface), all the stoppers 16 are pulled out and the cover 17 is placed on every through hole 12 to make the floor surface approximately flat (flush). Therefore, the safety and the general utility of the floor surface may be increased at the time of non-use of the floor structure 10.

Additionally, in the first embodiment described above, a case is described where the first positioning mechanism includes the three V-grooves 18, and where the first positioning target mechanism includes the three spherical bodies 23A to 23C. However, it is also possible to make the first positioning mechanism the three spherical bodies, and the first positioning target mechanism the three V-grooves.

Also, in the first embodiment described above, a case is described where the male connectors 22A to 22C are provided to the semiconductor manufacturing apparatus 20, and the female connectors 13A to 13C are connected to the floor structure 10. However, it is also possible to provide a female connector to the semiconductor manufacturing apparatus 20 and a male connector to the floor structure 10.

Furthermore, in the first embodiment described above, the male connectors 22A to 22C and the female connectors 13A to 13C for connecting a gas supply pipe, an exhaust gas pipe and an AC power cable are described. However, the usage of the male connectors 22A to 22C and the female connectors 13A to 13C is not limited, and the connectors may be used to connect a LAN cable (signal cable) or the like, for example.

Furthermore, in the first embodiment described above, the floor structure 10 allowing two semiconductor manufacturing apparatuses 20 to be installed on the floor plate 11 is described, but the present invention may likewise be applied to a floor structure 10 allowing one or three or more semiconductor manufacturing apparatuses 20 to be installed on a floor plate 11.

Moreover, in the first embodiment described above, a case is described where the present invention is applied to a manufacturing apparatus for a small-diameter semiconductor wafer, but the present invention may likewise be applied to a manufacturing apparatus for a semiconductor wafer having a large diameter of 8 inches or 12 inches, for example.

Still further, in the first embodiment described above, a case of application to the semiconductor manufacturing apparatus 20 is described as an example, but the present invention may likewise be applied to a manufacturing apparatus for manufacturing a device from other types of substrates (for example, an insulating substrate such as a sapphire substrate, or a conductive substrate such as an aluminum substrate), or from a treated substrate having a non-circular shape (such as a rectangle).

Additionally, in the first embodiment described above, a case is described where an elevation mechanism for the lift plate 33 of the carrier apparatus 30 is modified (specifically, the contact portions 38c of the pair of first arms 38 are made to move from the inclined surface portions 40a of the pair of wedge guides 40 onto the horizontal portions 40b when the lift plate 33 of the carrier apparatus 30 reaches the highest position) so as to allow the semiconductor manufacturing apparatus 20 to be safely and smoothly carried, and occurrence of situations where the lift plate 33 of the carrier apparatus 30 is lowered under the weight of the semiconductor manufacturing apparatus 20 during a time when the semiconductor manufacturing apparatus 20 is being carried is thereby prevented. However, it is needless to say that a wheel lock mechanism (not shown) for locking the wheel 36 so that the wheel 36 is not turned inadvertently in a state where the semiconductor manufacturing apparatus 20 is placed on the lift plate 33 of the carrier apparatus 30 may additionally be provided.

Furthermore, in the first embodiment described above, a case is described where the semi-spherical protruding positioning portion 41 of the carrier apparatus 30 is a fitting portion, and the V-groove 27 of the semiconductor manufacturing apparatus 20 is a fitting receiving portion. However, fitting portions other than the semi-spherical protruding positioning portion 41 and fitting receiving portions other than the V-groove 27 may also be used instead. For example, a V-groove (not shown) may be provided as the fitting portion of the carrier apparatus 30, and a semi-spherical protruding positioning portion (not shown) may be provided as the fitting receiving portion of the semiconductor manufacturing apparatus 20.

Furthermore, in the first embodiment described above, a case is described where the damper 42 of the carrier apparatus 30 is an abutting portion, and the pressing portion 28 of the semiconductor manufacturing apparatus 20 is an abutment receiving portion. However, abutting portions other than the damper 42 and abutment receiving portions other than the pressing portion 28 may also be used instead. For example, a pressing portion (not shown) may be provided as the abutting portion of the carrier apparatus 30, and a damper (not shown) may be provided as the abutment receiving portion of the semiconductor manufacturing apparatus 20.

Moreover, in the first embodiment described above, a case is described where the timing belt 43 and the ball screw 44 are used as the power transmission mechanism for converting rotation of the wheel 36 of the carrier apparatus 30 into forward-backward movement of the pair of wedge guides 40. However, other power transmission mechanisms (such as a drive shaft, a chain, a gear train, and the like) may be used together or instead.

Still further, in the first embodiment described above, the carrier apparatus 30 provided with the pair of first arms 38, the pair of second arms 39, and the pair of wedge guides 40 is described. However, the first arms 38, the second arms 39, and the wedge guides 40 do not necessarily have to be in pairs, and they may be provided in one or three or more pieces.

Still further, in the first embodiment described above, the carrier apparatus 30 provided with the frame 31 that is capable of moving on the floor surface by the rolling of the wheels (the front wheels 34 and the rear wheels 35) is described. However, the frame 31 of the carrier apparatus 30 does not necessarily have to move by the rolling of the wheels so long as it is capable of moving on the floor surface.

In an embodiment, a carrier apparatus to lift and carry a manufacturing apparatus includes a frame that is capable of moving on a floor surface, a first arm that is supported on the frame in a manner capable of rotating around one end portion, and a second arm that is supported on the frame in a manner capable of rotating around one end portion, a lift plate that is mounted on upper sides of another end portion of the first arm and another end portion of the second arm, and a wedge guide that is provided on the frame in a manner capable of advancing or retracting. When the wedge guide advances and an inclined surface portion of the wedge guide pushes a contact portion of the other end portion of the first arm up an inclined surface of the inclined surface portion, the first arm is rotated around the one end portion and the second arm is rotated around its one end portion in coordination with the first arm so as to raise the lift plate.

A horizontal portion can be formed at an upper portion of the wedge guide and, when the lift plate reaches a highest position, the contact portion can be moved onto the horizontal portion. The contact portion of the first arm can have a protruding curved shape and a horizontal portion of the wedge guide can be formed continuously to the inclined surface portion. The frame can be provided with a fitting portion to be fitted into a fitting receiving portion of the manufacturing apparatus. The frame can be positioned at a predetermined position with respect to the manufacturing apparatus by the fitting portion being fitted into the fitting receiving portion at a time of insertion of the lift plate under the manufacturing apparatus. The frame can be provided with an abutting portion to be abutted against an abutment receiving portion of the manmufacturing apparatus. Impact applied to the manufacturing apparatus by the frame can be mitigated by the abutting portion abutting against the abutment receiving portion at a time of insertion of the lift plate under the manufacturing apparatus.

REFERENCE SIGNS LIST

10 Floor structure
11 Floor plate
12 Through hole
13A, 13B, 13C Female connector (floor-side connector)
14A, 14B, 14C V-groove seat
15 Guide groove (second positioning mechanism)
16 Stopper
16a Contact portion
17 Cover
18 V-groove (first positioning mechanism)

20 Semiconductor manufacturing apparatus (manufacturing apparatus)
21 Bottom plate
22A, 22B, 22C Male connector (apparatus-side connector)
23A, 23B, 23C Spherical body (first positioning target mechanism)
24 Support column
25 Housing
26 Processing apparatus
27 Apparatus front chamber
27a Top plate
28 Container mount
29 Securing lever
30 Carrier apparatus
31 Frame
32 Guide plate (second positioning target mechanism)
33 Lift plate
34 Front wheel
35 Rear wheel
36 Wheel
37 Handle
40A Gas supply pipe
40B Exhaust gas pipe
43 Power transmission mechanism
A1, A2 Mounting region

The invention claimed is:

1. A free access floor structure comprising:
a floor plate that is installable on a floor surface, and
a floor-side connector which is connectable to one of a gas supply pipe and an exhaust gas pipe, and is provided to the floor plate so that, when the floor plate is installed on the floor surface, the floor-side connector faces upward, wherein
the free access floor structure is configured so that a semiconductor manufacturing apparatus, which includes a bottom plate and an apparatus-side connector provided to the bottom plate, is mountable on the free access floor structure through a lowering operation of the semiconductor manufacturing apparatus in which the semiconductor manufacturing apparatus is lowered integrally as one body together with the apparatus-side connector, toward the floor plate, with the floor plate installed on the floor surface, the floor-side connector facing upward, and the apparatus-side connector facing downward, and
the floor-side connector is configured so that the apparatus-side connector and the floor-side connector complete a connection to each other through the lowering operation, to thereby mount the semiconductor manufacturing apparatus on the free access floor structure through the lowering operation with the semiconductor manufacturing apparatus being connectable to the one of a gas supply line and an exhaust gas pipe through the connected apparatus-side connector and the floor-side connector,
so that the lowering operation thereby operates as a single operation to mount the semiconductor manufacturing apparatus on the free access floor structure and connect the apparatus-side connector and the floor-side connector to each other.

2. The free access floor structure according to claim 1, wherein the floor plate is provided with a first positioning mechanism to position the bottom plate of the manufacturing apparatus at a predetermined position with respect to the floor plate, so that fitting positions of the apparatus-side connector and the floor-side connector coincide with each other in a horizontal direction.

3. The free access floor structure according to claim 1, wherein the floor plate is provided with a second positioning mechanism to position, in a width direction, a frame of a carrier apparatus carrying the manufacturing apparatus.

4. The free access floor structure according to claim 1, wherein
the floor-side connector is attached to a through hole of the floor plate without protruding upward from an upper surface of the floor plate, and
the free access floor structure comprises a cover provided to the through hole in a detachable/attachable manner.

5. A semiconductor manufacturing apparatus comprising:
a bottom plate,
an apparatus-side connector provided to the bottom plate, and
a first positioning target mechanism provided to the bottom plate, wherein
the semiconductor manufacturing apparatus is configured so that the semiconductor manufacturing apparatus is mountable on a free access floor structure, which includes a floor plate, a floor-side connector provided to the floor plate and connectable to one of a gas supply pipe and an exhaust gas pipe, and a first positioning mechanism provided to the floor plate, through a lowering operation of the semiconductor manufacturing apparatus in which the semiconductor manufacturing apparatus is lowered integrally as one body together with the apparatus-side connector, toward the floor plate, with the floor plate installed on a floor surface, the floor-side connector facing upward, and the apparatus-side connector facing downward, and
the apparatus-side connector is configured so that the apparatus-side connector and the floor-side connector complete a connection to each other through the lowering operation, and the first positioning target mechanism is configured to cooperate with the first positioning mechanism through the lowering operation to position the bottom plate with respect to the floor plate, to thereby mount the semiconductor manufacturing apparatus on the free access floor structure through the lowering operation with the semiconductor manufacturing apparatus being connectable to the one of a gas supply line and an exhaust gas pipe through the connected apparatus-side connector and the floor-side connector,
so that the lowering operation thereby operates as a single operation to mount the semiconductor manufacturing apparatus on the free access floor structure and connect the apparatus-side connector and the floor-side connector to each other.

6. The semiconductor manufacturing apparatus according to claim 5, wherein
one of the first positioning mechanism and the first positioning target mechanism includes three V-grooves and the other of the first positioning mechanism and the first positioning target mechanism includes three spherical bodies, and
the first positioning target mechanism cooperates with the first positioning mechanism so that the bottom plate is positioned with respect to the floor plate by the spherical bodies becoming fitted into the corresponding V-grooves.

7. The semiconductor manufacturing apparatus according to claim 6, wherein the three V-grooves are formed along a substantially Y shape in plan view.

8. An apparatus comprising:
a free access floor structure including
- a floor plate that is installable on a floor surface, and
- a floor-side connector that is connectable to one of a gas supply pipe and an exhaust gas pipe, and is provided to the floor plate so that, when the floor plate is installed on the floor surface, the floor-side connector faces upward, and a semiconductor manufacturing apparatus including
- a bottom plate, and
- an apparatus-side connector provided to the bottom plate, wherein
- the semiconductor manufacturing apparatus and the free access floor structure are configured so that the semiconductor manufacturing apparatus is mountable on the free access floor structure through a lowering operation of the semiconductor manufacturing apparatus in which the semiconductor manufacturing apparatus is lowered integrally as one body together with the apparatus-side connector, toward the floor plate, with the floor plate installed on a floor surface, the floor-side connector facing upward, and the apparatus-side connector facing downward, and
- the apparatus-side connector and the floor-side connector are configured so that the apparatus-side connector and the floor-side connector complete a connection to each other through the lowering operation, to thereby mount the semiconductor manufacturing apparatus on the free access floor structure through the lowering operation with the semiconductor manufacturing apparatus being connectable to the one of a gas supply line and an exhaust gas pipe through the connected apparatus-side connector and the floor-side connector,
- so that the lowering operation thereby operates as a single operation to mount the semiconductor manufacturing apparatus on the free access floor structure and connect the apparatus-side connector and the floor-side connector to each other.

* * * * *